United States Patent [19]
Weich et al.

[11] Patent Number: 5,940,207
[45] Date of Patent: Aug. 17, 1999

[54] WAVELENGTH CONVERTER

[75] Inventors: Klaus Weich; Randolph Eggemann; Erwin Patzak, all of Berlin, Germany

[73] Assignee: Heinrich-Hertz-Institut fuer Nachrichtentechnik Berlin GmbH., Berlin, Germany

[21] Appl. No.: 08/983,426
[22] PCT Filed: Jun. 28, 1996
[86] PCT No.: PCT/DE96/01193
§ 371 Date: Dec. 30, 1997
§ 102(e) Date: Dec. 30, 1997
[87] PCT Pub. No.: WO97/02634
PCT Pub. Date: Jan. 23, 1997

[30] Foreign Application Priority Data

Jun. 30, 1995 [DE] Germany .......................... 195 25 117

[51] Int. Cl.$^6$ ................................ H01S 3/00; G02F 1/35
[52] U.S. Cl. ........................................... 359/333; 359/326
[58] Field of Search .................................... 359/333, 344, 359/237, 278, 326

[56] References Cited

U.S. PATENT DOCUMENTS 5,264,960 11/1993 Glance .................................... 359/344
5,734,493 3/1998 Jopson .................................... 359/326

OTHER PUBLICATIONS

Simon, J.C. et al.: "Two–stages wavelength converter with improved extinction ration", OFC 1995, San Diego, CA.

Perino, J.S. et al.: Proceedings of 1994 Conference on Lasers and Electro–Optics and the International Electronics Conference CLEO/IQEC, Anaheim, CA, May 8–13 ?, pp. 298–299.

*Primary Examiner*—Mark Hellner
*Attorney, Agent, or Firm*—Karl Hormann

[57] ABSTRACT

The invention relates to a wavelength converter for converting a first light signal used for data transmission and having a first wavelength ($\lambda_{in}$) into a second light signal having a second wavelength ($\lambda_{out}$). The wavelength converter signal comprises a signal input for picking up the first light signal, a signal output for emitting the second light signal, a modulatable optical semiconductor amplifier (4) with an input, an output and modulation input and a first laser light source (L1), which forms a first stage with the semiconductor amplifier (4). The input of the semiconductor amplifier (4) is connected to the first laser light source (L1) and the modulation input of the semiconductor amplifier (4) is connected to the signal input for cross amplification modulation. The first laser light source (L1) emits light with a third wavelength ($\lambda_{int}$). Arranged downstream of the first stage (1) by means of an optical coupler (3) is a second stage (2) which contains a modulatable second laser light source which emits light at the second wavelength ($\lambda_{out}$) and has a modulation input and an output. The modulation input of the second laser light source is connected to the output of the semiconductor amplifier and the output of the second laser light source is connected to the signal output.

9 Claims, 3 Drawing Sheets

WAVELENGTH CONVERTER

BACKGROUND OF THE INVENTION

1. Field of the Invention

The invention relates to a wavelength converter for converting a first light signal of a first wavelength for transmitting data into a second light signal of a second wave-length, having signal input for receiving the first light signal, a signal output for emitting the second light signal, a modulatable optical semiconductor amplifier with an input, an output and modulation input, a first laser light source which with the semiconductor amplifier forms a first stage, with the input of the semiconductor amplifier being connected to the first laser light source and the modulation input of the semiconductor amplifier being connected to the signal input for cross amplification modulation and the first laser light source emitting light of a third wavelength, and wherein a second stage is connected to the output first stage by a coupling element, the second stage being provided with a second laser light source emitting light of the second wavelength and with a modulatable component.

Wavelength converters are required, inter alia, in optical data transmission systems in which data is transmitted by time or wavelength multiplexing.

In digital data transmission, data may be transmitted by light signals of two different levels, each corresponding to a binary signal. Since in data transmission, the error rate is influenced by the spacing between the two logic levels, it is desirable that the inter-level spacing of the input signal be not reduced by any wavelength conversion. In wavelength conversion the level spacing is determined by the so-called extinction factor, the extinction factor achievable with a single semiconductor amplifier being as a rule too low to maintain the level spacing of the input signal in the output signal. Cascading two semiconductor amplifiers for wavelength conversion will result in an increasing deterioration of the extinction, i.e., in a reduction of the extinction factor.

2. The Prior Art

In SIMON, J. C., et al.: Two-stages wavelength converter with improved extinction ratio, OFC 1995, San Diego, U.S.A., there is described a dual stage optical wavelength converter, by which a light signal may be converted from a first wavelength to a second wavelength.

The wavelength converter described in this prior publication is provided with two optical series-connected semiconductor amplifiers each of which amplifies a light signal applied to its input. A light signal from a laser light source having a wave-length of $\lambda_{int}$ and operating in a continuous wave is applied to the input of the first amplifier and does not, therefore, transmit any data. Furthermore, the two semiconductor amplifiers are each equipped with a modulation input connected to the signal input of the wavelength converter.

Hence, the light signal of wavelength $\lambda_{in}$ applied to the signal input of the wavelength converter modulates the amplification of the two semiconductor amplifiers, the amplification factors of which, because of saturation effects, will decrease as the level of the modulation signal increases.

The modulation signal of wavelength $\lambda_{in}$ and the light signal of wavelength $\lambda_{int}$ are coupled into the semiconductor amplifiers in opposite directions so that only the signal of wavelength $\lambda_{int}$ will leave the semiconductor amplifiers in the direction of the signal output.

If the level of the modulation signal of wavelength $\lambda_{in}$ is relatively high, the semiconductor amplifiers are driven to saturation so that the amplification factor and, hence, the levels of any output signals will be relatively low. If, by contrast, the level of the modulation signal of wavelength $\lambda_{in}$ in relatively low, then the amplification factor of the semiconductor amplifiers and the level of any output signals will be relatively high. That is to say that the polarity of the output signals of the two semiconductor amplifiers is inverted relative to the input signal of the wavelength converter.

Between the two semiconductor amplifiers there is arranged, on the one hand, a unidirectionally effective optical isolator and, on the other hand, an optical dampening member. The isolator blocks the light emitted by the second stage semiconductor amplifier in the direction of the first stage and this prevents disturbance of the first stage. The dampening member, on the other hand, sets the level of the output signal of the first semiconductor amplifier.

The described wavelength converter advantageously allows conversion of a first wavelength in a strictly optical manner into a second wavelength without intermediate electro-optic transducers.

Advantageously, the conversion is substantially immune from changes of the polarity and of the wavelength of the input signal, since amplification by the semiconductor amplifiers is substantially independent of polarization and wavelengths.

Nevertheless, the mentioned wavelength converter suffers from a variety of disadvantages.

Firstly, this wavelength converter inverts the signal polarity of the input signal. Thus, if several wavelength converters are arranged in a cascading manner, the number of cascaded wavelength converters must be considered in evaluating the signal. In an optical data transmission system this would be entail significant complexity, and it would limit flexibility.

Secondly, conversion by optical semiconductor amplifiers is dependent upon the position of the wavelengths of input and output signal. Thus, conversion by optical semiconductors works best when converting larger into smaller wavelengths.

Moreover, a distorted input signal is reproduced as a distorted signal at the output. This is a particular drawback where several wavelength converters are arranged in a cascade, as in such an arrangement noise is accumulated thus limiting the number of cascaded wavelength converters.

Moreover, the wavelength converter provides an output signal of a relatively unclean frequency spectrum ("chirp"). Because of the dispersion inherent in light waveguides, this, in transmitting the output signal through a light waveguide, will result in a distortion of the transmitted signal and, therefore, to a restriction of the distance over which transmission is possible without intermediate amplifiers or repeaters.

In U.S. Pat. No. 5,264,960, there is described a wavelength converter which is constructed of two stages, each stage being based upon the cross gain modulation (XGM—cross gain modulation) and provided with a modulatable optical semiconductor amplifier having an input, an output and a modulation input and a laser light source, the two stages being connected to each other by an optical coupling element. However, when cascading two XGM converters a chirped signal will result which is imprecise in terms of its wavelength. In the transmission of date over standard single-mode fibers this spectral uncleaness is, however, disadvantageous because it makes transmission of 10 Gbit/s impossible even over a small distance of 20 km and because signal distrotions are recognizable at low bit rates already (vide J. S. Perino; J. M. Wiesenfeld "Proceedings of 1994 Conference on Lasers and Electro-Optics and the International Electronics Conference CLEO/IQEC, Anaheim, Calif., USA, 8–13 May, pp. 298–299).

OBJECT OF THE INVENTION

It is, therefore, a particular task of the invention to provide a wavelength converter of the kind mentioned supra which makes possible a conversion of wavelengths at high precision substantially without distortions and with a high extinction factor.

SUMMARY OF THE INVENTION

The task is accomplished by a wavelength converter of the kind referred to supra the modulatable component of the second stage of which in accordance with the invention is provided with a Fabry-Perot laser provided with an input for the second laser light source feeding light of the second wavelength into the Fabry-Perot laser, with an output and a modulation input, whereby the output of the Fabry-Perot laser is connected to the signal output and the modulation input of the Fabry-Perot laser is connected to the output of the semiconductor amplifier and the coupling element is provided with at least one circulator.

In the two-stage wavelength converter in accordance with the invention the first stage consists essentially of an optical semiconductor amplifier provided with an input, an output and a modulation input. The light signal of a first laser light source operating in a continuous wave mode at wavelength $\lambda_{int}$ is applied to the input of the semiconductor amplifier. The modulation input of the semiconductor laser is connected to the signal input of the wavelength converter.

Therefore, the light signal applied to the signal input of the wavelength converter modulates the light signal from the first laser with wavelength $\lambda_{int}$. In this process, the modulation is carried out by a cross amplification modulation.

The cross amplification modulation is based upon the dependency of the amplification factor from the input level. Thus, as the level of the modulation signal becomes larger, the amplification factor becomes smaller with increasing saturation of the amplifier. If the level of the modulation signal is relatively high, the amplification factor and, accordingly, the level of the output signal of wavelength $\lambda_{int}$ will be relatively low. Conversely, at a relatively low level modulation signal the amplification factor and, hence, the level of the output signal of wavelength $\lambda_{int}$ will be relatively high. Therefore, the signal polarity of the output signal of the semiconductor amplifier will be of inverted polarity relative to the modulation signal.

The optical semiconductor amplifier delivers an output signal of a defined wavelength $\lambda_{int}$ substantially independently of the wavelength and polarization of the input signal. For that reason, the wavelength converter is substantially insensitive to deviations of the polarity or changes in the wavelength of the input signal and accordingly it is very flexible at its input side.

In a preferred embodiment the modulation input and the output of the semiconductor amplifier are located at one side of semiconductor amplifier, and the input is located at the opposite side. The modulation signal and the continuous wave sight signal of the first laser are, therefore, coupled into the semiconductor amplifier from different directions. Thus, it is chiefly light of wavelength $\lambda_{int}$ which leaves the semiconductor amplifier, whereas hardly any of the light of wavelength $\lambda_{in}$ emitted by the signal input of the wavelength converter and entering the semiconductor amplifier at its modulation input is conducted in the direction of the second stage. This is important so that the input signal of wavelength $\lambda_{int}$ of the first stage is not deleteriously superposed on the output signal of wavelength $\lambda_{int}$ thereof. In this embodiment, and with a sufficiently high antireflection, the wavelength $\lambda_{in}$ of the input signal may be equal to the wavelength $\lambda_{int}$ of the laser since the light signal applied to the input of the wavelength converter cannot leave the semiconductor amplifier because of the disposition of modulation input and output.

In another embodiment, a filter which blocks light of wavelength $I_{in}$ is arranged for the same purpose behind the output of the semiconductor.

The second stage of the wavelength converter consists of a Fabry-Perot-laser, and a laser light source emitting light of wavelength $\lambda_{out}$. The CW light of wavelength $\lambda_{out}$ from this second laser light source and the light of wavelength $\lambda_{int}$ emitted from the semiconductor amplifier are coupled into the Fabry-Perot laser by means of a coupling element and by "injection induced" switching it causes modulation of the radiation of wavelength $\lambda_{out}$. Upon coupling in of a data pulse, the Fabry-Perot laser converts from a state locked to wavelength $\lambda_{out}$ into a non-locked state (inverted modulation) or vice versa (non-inverted modulation).

Inverted or non-inverted modulation may selectively be set—as has already been mention—by way of the operating conditions of the second stage.

By double inversion by the semiconductor amplifier on the one hand, and by the Fabry-Perot laser of the second stage on the other hand, the output signal will be of the same polarity as the input signal of the wavelength converter. This is of especial importance where several wavelength converter are cascaded, as otherwise an inversion of the signal polarity by the wavelength converter would necessitate consideration of the number of cascaded wavelength converters for purposes of signal evaluation.

Because of the use of a laser light source as the converter, the transmission function of the second stage is highly non-linear, similar to a threshold element. In digital data transmission with two logic levels corresponding to the two binary signals, the output signal of the wavelength converter of the wavelength converter for this reason has clearly defined levels largely independent of disturbances in the input signal of the second stage. On the one hand, this results in greater flexibility as regards the requirements for the first stage and, on the other hand, in a regeneration of the input signal by the wavelength converter. Hence, even an input signal with relatively strong noise superposed thereon can be converted correctly and with clearly defined output levels. Advantageously, the regeneration of the input signal makes it possible to cascade a plurality of wavelength converters.

Thus, the wavelength converter in the first stage initially converts a light signal of wavelength $\lambda_{in}$ into the internal wavelength $\lambda_{int}$ and thereafter, in the second stage, into the output wavelength $\lambda_{out}$.

In a particularly advantageous embodiment of the invention the wavelength of the laser in the second stage may be tunable. In this fashion, the wavelength converter may address different output channels each having a different wavelength.

In a further embodiment of the invention the internal wavelength $\lambda_{int}$ is shorter, on the one hand, than the wavelength $\lambda_{in}$ of the input signal and, on the other hand, shorter than the wavelength $\lambda_{out}$ of the output signal. To this end, advantageous use is made of the fact that the second stage with its laser light source as the wavelength converter functions relatively well for converting a shorter wavelength into a longer one whereas the semiconductor amplifier is better suited for converting a light signal from a longer wavelength into a shorter one. That is to say that the second stage is compensating the frequency response of the first stage. The internal wavelength $\lambda_{int}$ is thus selected such that the semiconductor amplifier operates in an optimum fashion at the predetermined wavelength $\lambda_{in}$ of the input signal.

The laser light source of the second stage provides a light signal of a relatively narrow banded frequency range. For that reason, the output signal of the wavelength converter is subject to relatively low distortion only during transmission through a light waveguide in spite of the distortion occurring in light waveguides. This is of advantage for transmission over relatively large distances without intermediate amplifiers (repeaters).

Moreover, even at an input signal from the wavelength converter of relatively unclean spectral purity (chirp) the laser of the second stage will deliver a relatively narrow-banded output signal. An input signal detrimentally affected by "chirp" is thus regenerated by the wavelength converter. This advantageously lowers the error rate in data transmission or increases the possible transmission distance, as the case may be, and it allows many wavelength converters to be cascaded.

Furthermore and as described supra, the semiconductor amplifier is substantially independent of the wavelength of the input signal. For that reason, the wavelength converter in accordance with the invention may embrace several input channels of different wavelengths. In this connection, the wavelength dependency of the extinction factor is relatively insignificant which is achieved by the utilizing the laser light source as a converter in the second stage.

In a special variant of the invention of its own inventive significance the coupling element for connecting the two stages of the wavelength converter essentially consists of a four gate circulator connected to the signal input of the wavelength converter, the modulation input and the output of the semiconductor amplifier, the modulation output and the output of the laser of the second stage as well as with the signal output of the wavelength converter.

The circulator couples light from the signal input of the wavelength converter into the modulation input of the semiconductor amplifier, from the output of the semiconductor amplifier to the modulation input of the laser of the second stage, as well as from the output of the second stage into the signal output of the wavelength converter. Such a circulator on the one hand insures optical isolation of the two stages of the wavelength converter and, on the other hand, it advantageously has a relatively low coupling loss of less than 1 dB.

In another variant of the invention the coupling element consists of two series-connected circulators, the first circulator being connected to the signal input of the wavelength converter as well as to the modulation input and to the output of the semiconductor amplifier. The second circulator, on the other hand, is connected to the modulation input and the output of the laser of the second stage as well as to the signal output of the wavelength converter.

The first circulator couples light from the signal input of the wavelength converter into the modulation input of the semiconductor amplifier and from the output of the semiconductor amplifier into the second circulator. In the second stage, the second circulator thereafter couples the light from the first circulator into the modulation input of the laser and feeds the output signal of the second stage to the signal output of the wavelength converter. In this operation, the great flexibility is of advantage, as further components, e.g. optical amplifiers, may be connected between the two circulators.

In another preferred embodiment the optical coupling element is provided with conventional couplers structured, for instance, as 3 dB directional couplers.

Hence, the wavelength converter in accordance with the invention combines the advantages of an optical semiconductor amplifier as the input stage (independence of polarization and wavelength, reception of several input channels of different wavelengths) with the advantages of a laser converter as the output stage (regeneration of the input signal by a threshold-like transmission function, high extinction ratio of the output signal, purity of the output spectrum, equally good conversion into longer as well as shorter wavelengths), and it makes it possible freely to select the data rate over a wide range.

Advantageously, the wavelength converter in accordance with the invention is a hybrid structure with individual components or an opto-electronic integrated circuit on a chip. Other structures are possible as well.

DESCRIPTION OF THE SEVERAL DRAWINGS

Other advantageous improvements of the invention have been characterized in the subclaims or they will hereafter be described in greater detail together with the preferred embodiment of the invention with reference to the drawings, in which:

DESCRIPTION OF PREFERRED EMBODIMENTS

Figure 1:
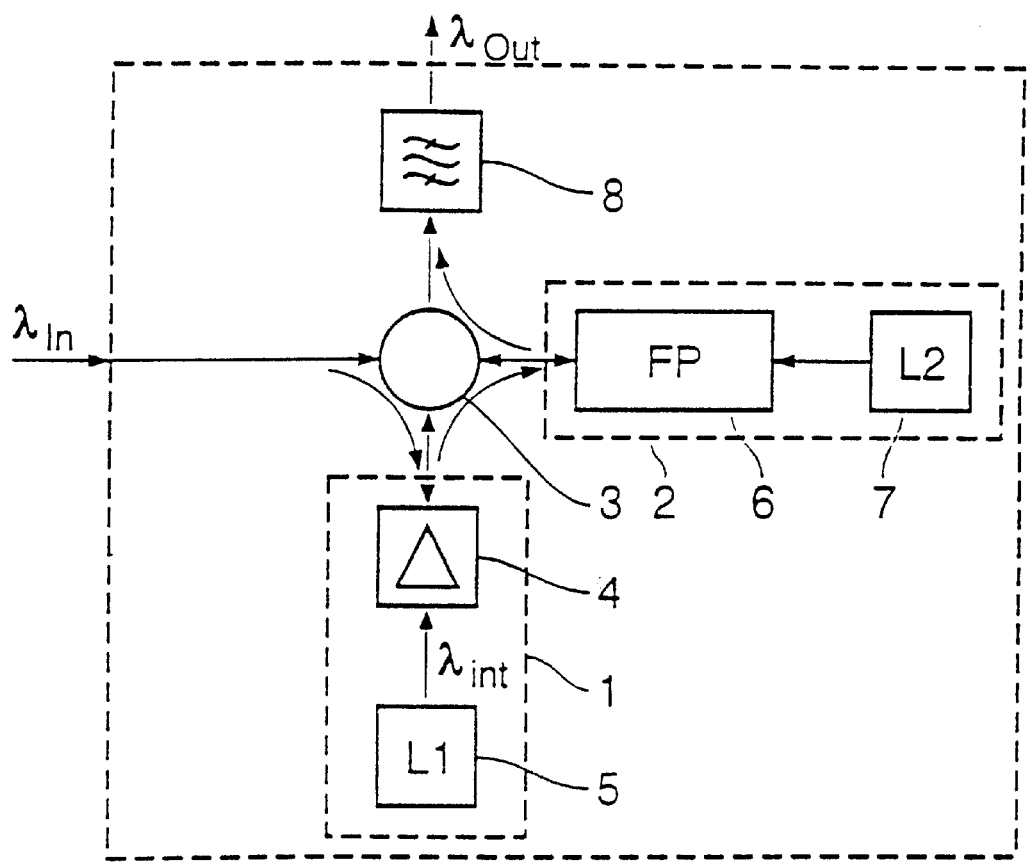
FIG. 1 is a block diagram of a wavelength converter including a four gate circulator as the preferred embodiment of the invention.

The wavelength converter shown in FIG. 1 makes it possible to convert the wavelength $\lambda_{in}$ of a light signal into the wavelength $\lambda_{out}$. It is particularly suited for use in optical data transmission systems with light waveguides in which wavelength and time multiplexing are employed for optimizing the rate of transmission.

The wavelength converter consists of two stages 1, 2 which are connected to each other by an optical four gate circulator 3.

On the one hand, the four gate circulator 3 couples the light signal of wavelength $\lambda_{in}$ present at the signal input of the wavelength converter into the first stage 1. On the other hand, the four gate circulator 3 connects the two stages 1, 2 with each other and feeds the output signal of the first stage 1 to the second stage 2. Furthermore, the circulator 3 feeds the output signal of the second stage 2 to the signal output of the wavelength converter.

Initially the first stage 1 converts the light signal present at the signal input of the wavelength converter into the internal wavelength $\lambda_{int}$, whereas the second stage 1 thereafter converts this light signal of wavelength $\lambda_{int}$ into the output wavelength $\lambda_{out}$.

In essence, the first stage 1 consists of an optical semiconductor amplifier 4 to one side of which is fed the radiation from the laser light source 5 (hereafter abbreviated to "laser") of wavelength $\lambda_{int}$, and to the other side of which is fed the light signal of wavelength $\lambda_{in}$ present at the signal input of the wavelength converter. As the output of the semiconductor amplifier 4 is present on the side to which the input signal of wavelength $\lambda_{in}$ is fed, it is primarily a light signal of wavelength $\lambda_{int}$ which leaves the semiconductor amplifier 4, while the input signal of wavelength $\lambda_{in}$ serves only for modulation and leaves the semiconductor amplifier 4 in the direction of the second stage in no more than a negligible quantity.

Modulation of the semiconductor amplifier 4 is carried out by cross amplification modulation. The cross amplification modulation is based upon the dependency of the amplification factor from the input level of the semiconductor amplifier 4. Thus the amplification factor is reduced as the input level increases as the semiconductor amplifier 4 is driven into saturation.

If a light signal of wavelength $\lambda_{in}$ with a relatively high level is present at the input of the wavelength converter it will result in a relatively low amplification because of the saturation of the semiconductor amplifier 4 and, hence, in a relatively low level of the output signal of wavelength $\lambda_{int}$.

If, on the other hand, the input signal of the wavelength converter is of relatively low level the semiconductor amplifier will have a relatively high amplification factor which will correspondingly result in a relatively high level at the output of the semiconductor amplifier 4.

Thus, at the output of the semiconductor amplifier 4 there appears a light signal of wavelength $\lambda_{int}$ which will be modulated by the input signal and which relative thereto will be of inverted polarity.

The semiconductor amplifier 4 is substantially insensitive to deviations of polarization and wavelength of the input signal; but it does deliver an output signal of a constant wavelength $\lambda_{int}$ and constant polarization. For that reason, the wavelength converter is very flexible as regards its input and puts low demands on the consistency and wavelength of the input signal. The wavelength converter may therefore receive different channels with different wavelengths.

The output signal of the semiconductor amplifier 4 is fed as a modulation signal through the four gate circulator 3 to the Fabry-Perot laser 6 into which there is also coupled CW light of wavelength $\lambda_{in}$ from a further laser light source 7. Depending upon the level of the modulation signal of wavelength $\lambda_{int}$, because of the so-called "injection-locking" the Fabry-Perot laser 6 is locked either to wavelength $\lambda_{int}$ or to wavelength $\lambda_{out}$ of the laser light source 7.

If the output signal of the semiconductor amplifier 4 has a high level the Fabry-Perot laser 6 will be locked to wavelength $\lambda_{int}$; at a low level output signal from the semiconductor laser 4 the Fabry-Perot laser 6 will be locked to the wavelength $\lambda_{out}$ of the laser light source 7.

The two signals of wavelengths $\lambda_{int}$ and $\lambda_{out}$ are fed from the four gate circulator 3 to a filter 8 which blocks light of wavelength $\lambda_{int}$.

The output signal of the wavelength converter thus has a relatively high level if the Fabry Perot laser 6 is locked to wavelength $\lambda_{out}$ of the laser light source 7, i.e., if the output signal of the semiconductor amplifier 4 is of a relatively low level. Conversely, the output signal of the wavelength converter will be of a relatively low level if the level of the output signal of the semiconductor amplifier 4 is relatively high.

The second stage, therefore, inverts the polarity of the signal for a second time so that the output signal and the input signal of the wavelength converter are of the same polarity. This makes cascading of the wavelength converter possible, since otherwise, if the wavelength converter inverted the polarity of the signal, the number of cascaded wavelength converters would have to be taken into consideration during signal evaluation.

The wavelength conversion in the second stage is carried out relatively abruptly at a strongly non-linear transfer function, similar to a threshold stage. During transmission of digital signals with a level for each of the two binary signals the spacing between the two logic levels is, therefore, improved, and in this manner the bit error rate is reduced, or the greatest possible distance of transmission is enlarged. Thus, the second stage with its Fabry-Perot laser 6 regenerates the input signal. This, in turn, makes it possible to cascade numerous wavelength converters, as the signal in each wavelength converter is "refreshened" and, thus, no noise can accumulate.

Moreover, the second stage makes possible conversion of the input signal into different wavelengths $\lambda_{out}$. For that purpose, if would only be necessary to tune the laser light source 7 differently which leads to an excitation of other modes of the Fabry-Perot laser 6. The number of possible emission frequencies is limited only by the tuning range of the laser light source 7. For frequency tunable laser diodes the range may be up to 15 nm. Since the frequency spacing of the Fabry-Perot laser 6 is 0.7 nm, the wavelength converter may thus address twenty-one channels. In this manner, and by varying the temperature of the laser by less than 3 to 4° C. any desired output wavelength λout may in principle be set within the tuning range.

Figure 2:
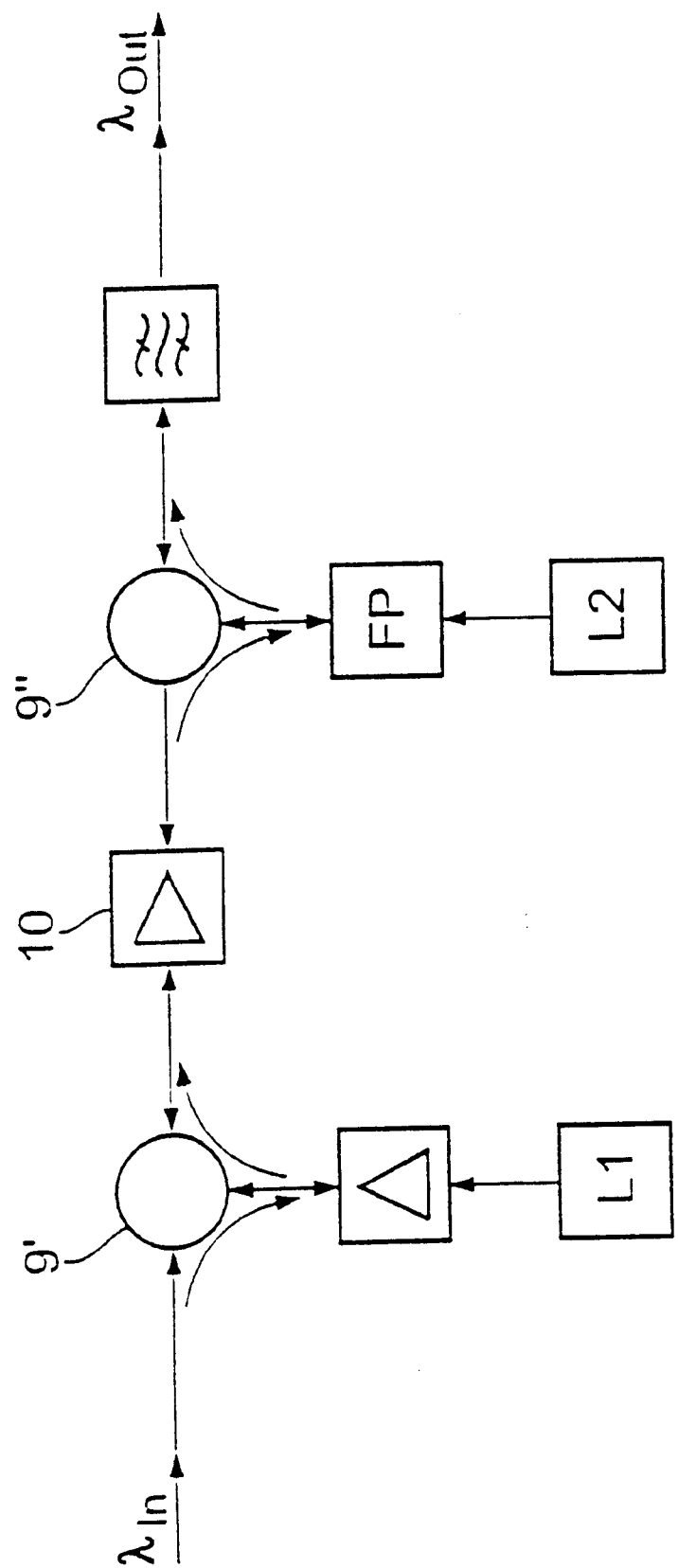
FIG. 2 is a block diagram of a further embodiment of the invention including two three gate circulators.

In FIG. 2, two three gate circulators 9', 9" are connected instead of the four gate circulator, all other components and their functions being the same as in FIG. 1. Between the two three gate circulators 9', 9" there is arranged an optical amplifier 10 which provides for a flexible application of the wavelength converter.

Figure 3:
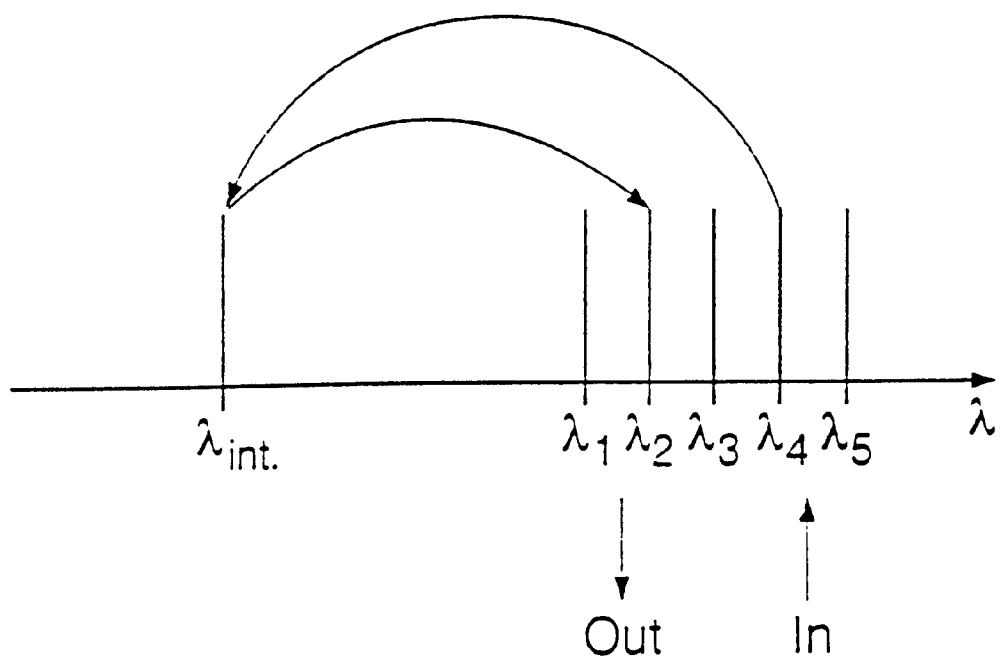
FIG. 3 is a schematic functional representation of the wavelength conversion in accordance with the invention.

The diagram depicted in FIG. 3 explains the wavelength conversion by the wavelength converter in accordance with the invention.

Because of the use of an optical semiconductor amplifier the first stage of the wavelength converter is relatively insensitive to the wavelength and polarization of the input signal. For that reason, the wavelength converter may receive input channels with different wavelengths $\lambda_1$ to $\lambda_5$. Initially, the first stage then converts the input signal regardless of its wavelength into the internal wavelength $\lambda_{int}$. Since the semiconductor amplifier is substantially more capable of conversion to shorter wavelengths than to longer ones, the wavelength $\lambda_{int}$ is selected so as to optimize the conversion performance of the semiconductor amplifier. To this end, the internal wavelength $\lambda_{int}$ is determined by the wavelength of the laser connected to the semiconductor amplifier.

The second stage thereafter converts the output signal of wavelength $\lambda_{int}$ from the first stage into output wavelength $\lambda_1$, $\lambda_2$, $\lambda_3$, $\lambda_4$ or $\lambda_5$ which is determined by the wavelength of the laser light source of the second stage. By tuning the wavelength of this laser light source different output channels may thus be addressed, including $\lambda_{in}=\lambda_{out}$.

The invention is not limited in its execution to the preferred embodiments described supra. Rather, a number of variants are conceivable which utilizes the described solution even with embodiments of totally different structures.

What is claimed is:

1. A wavelength converter for converting a first light signal of a first wavelength ($\lambda_{in}$) serving to transmit data into a second light signal of a second wavelength ($\lambda_{out}$), with a signal input for receiving the first light signal, a signal output for emitting the second light signal, a modulatable optical semiconductor amplifier (4) with an input, an output and a modulation input, a first laser light source (L1) forming a first stage with the semiconductor amplifier (4), whereby the input of the semiconductor amplifier (4) is connected with the first laser light source (L1) and the modulation input of the semiconductor amplifier (4), for cross amplification modulation, is connected to the signal input and the first laser light source (L1) emits light of a third wavelength ($\lambda_{int}$), and in which a second stage (2) is connected to the output of the first stage (1) by a coupling element, the second stage being provided with a second laser light source emitting light of the second wavelength ($\lambda_{out}$) and with a modulatable component, characterized by the fact that the modulatable component of the second stage (2) is provided with a Fabry-Perot amplifier having an input for the second laser light source (L2) feeding light of the second wavelength ($\lambda_{out}$) into the Fabry-Perot laser, an output and a modulation input, whereby the output of the Fabry-Perot laser (FP) is connected to the signal output and the modulation input of the Fabry-Perot laser (FP) is connected to the output of the semiconductor amplifier (4) and the coupling element is provided with at least one circulator.

2. The wavelength converter according to claim 1, characterized by the fact that the output signal of the semiconductor amplifier (4) modulates the Fabry-Perot laser (FP) by injection locking.

3. The wavelength converter according to claim 1, characterized by the fact that the third wavelength ($\lambda_{int}$) of the semiconductor amplifier (4) is shorter than the first wavelength ($\lambda_{in}$) and the second wavelength ($\lambda_{out}$) so that a reduction of the wavelength is performed by the first stage (1) and an increase of the wavelength is performed by the second stage (2).

4. The wavelength converter according to claim 1, characterized by the fact that a filter (8) blocking light of the third wavelength ($\lambda_{int}$) is connected to the output of the second stage (2).

5. The wavelength converter according to claim 1, characterized by the fact that the coupling element (3) is provided with a circulator having for connections, the first connection being connected to the signal input, the second connection being connected to the output and to the modulation input of the semiconductor amplifier (4), the third connection being connected to the modulation input and the output of the second stage (2) and the forth connection being connected to the signal output, whereby the circulator (3) feeds light from the first to the second connection, from the second to the third connection, and from the third to the fourth connection.

6. The wavelength converter according to claim 1, characterized by the fact that the coupling element is provided with two circulators (9', 9") each having three connections, whereby the third connection of the first circulator (9') is connected to the first connection of the second circulator (9"), that at the first circulator (9') the first connection is connected to the signal input and the second connection is connected to the output and to the modulation input of the semiconductor amplifier, that at the second circulator (9") the second connection is connected to the output and to the modulation input of the second stage and the third connection is connected to the signal output, that each of the two circulators (9', 9") feed light from the first to the second and from the second to the third connection.

7. The wavelength converter according to claim 1, characterized by the fact that for optimizing the conversion performance of the semiconductor amplifier (4) the first laser light source (5) is tuneable.

8. The wavelength converter according to claim 1, characterized by the fact that the second laser light source (7) is tuneable for addressing a plurality of output channels.

9. The wavelength converter according to claim 1, characterized by the fact that for blocking the first light signal the output and the modulation input on the one hand and the input on the other hand of the semiconductor amplifier (4) are arranged on opposite sides of the semiconductor amplifier (4).

* * * * *